(12) United States Patent
Chang

(10) Patent No.: US 11,637,381 B2
(45) Date of Patent: Apr. 25, 2023

(54) ANTENNA IN PACKAGE STRUCTURE AND MANUFACTURING METHOD THEREFOR

(71) Applicant: Huawei Technologies Co., Ltd., Shenzhen (CN)

(72) Inventor: Ming Chang, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 17/232,798

(22) Filed: Apr. 16, 2021

(65) Prior Publication Data
US 2021/0305710 A1 Sep. 30, 2021

Related U.S. Application Data

(63) Continuation of application No. PCT/CN2018/111041, filed on Oct. 19, 2018.

(51) Int. Cl.
*H01Q 13/18* (2006.01)
*H01Q 1/22* (2006.01)
(Continued)

(52) U.S. Cl.
CPC ............ *H01Q 13/18* (2013.01); *H01L 23/66* (2013.01); *H01Q 1/2208* (2013.01);
(Continued)

(58) Field of Classification Search
CPC .. H01Q 13/18; H01Q 1/2208; H01Q 13/0283; H01Q 1/2283; H01Q 21/065; H01L 23/66; H01L 24/16; H01L 2224/16227; H01L 2224/81192; H01L 2223/6677; H01L 2924/1421;
(Continued)

(56) References Cited

U.S. PATENT DOCUMENTS 7,972,965 B2 * 7/2011 Cooney, III ...... H01L 21/76829
438/700
9,620,464 B2 4/2017 Baks et al.
(Continued)

FOREIGN PATENT DOCUMENTS

CN 102217064 A 10/2011
CN 103400829 A 11/2013
(Continued)

OTHER PUBLICATIONS

Yuan, Bo., et al., "An integrated LTCC AIP for millimeter wave wireless receiving system," Journal of Infrared and Millimeter Waves, vol. 32, No. 1, Feb. 2013, 7 pages.

*Primary Examiner* — Andrea Lindgren Baltzell
*Assistant Examiner* — Yonchan J Kim
(74) *Attorney, Agent, or Firm* — Conley Rose, P.C.

(57) ABSTRACT

In an antenna in package structure, a plurality of supporting blocks spaced apart from each other are disposed between a first substrate and a second substrate, and an antenna cavity is formed between every two adjacent supporting blocks. Therefore, a height of the supporting block determines a height of the antenna cavity. The supporting blocks spaced apart from each other are located between the first substrate and the second substrate, and at least one of the first substrate or the second substrate adheres to the supporting blocks spaced apart from each other using an adhesive layer.

20 Claims, 6 Drawing Sheets

(51) Int. Cl.
  *H01Q 13/02* (2006.01)
  *H01Q 21/06* (2006.01)
  *H01L 23/66* (2006.01)
  *H05K 3/46* (2006.01)

(52) U.S. Cl.
  CPC ....... *H01Q 1/2283* (2013.01); *H01Q 13/0283* (2013.01); *H01Q 21/065* (2013.01); *H05K 3/4697* (2013.01)

(58) Field of Classification Search
  CPC ........ H01L 2924/15321; H05K 3/4697; H05K 2203/063; H05K 3/4611; H05K 2201/10098; H05K 2201/2072
  See application file for complete search history.

(56) References Cited

U.S. PATENT DOCUMENTS

| | | | | |
|---|---|---|---|---|
| 2002/0189091 | A1* | 12/2002 | Ding | H05K 3/462 |
| | | | | 29/830 |
| 2011/0285606 | A1 | 11/2011 | De Graauw et al. | |
| 2014/0035097 | A1 | 2/2014 | Lin et al. | |
| 2014/0083744 | A1* | 3/2014 | Hu | H05K 3/0058 |
| | | | | 156/247 |
| 2014/0110858 | A1 | 4/2014 | Beer et al. | |
| 2014/0152509 | A1 | 6/2014 | Liu et al. | |
| 2015/0188218 | A1 | 7/2015 | Elsherbini et al. | |
| 2015/0207233 | A1 | 7/2015 | Kim et al. | |
| 2016/0351996 | A1 | 12/2016 | Ou | |
| 2017/0048981 | A1 | 2/2017 | Hu et al. | |
| 2017/0125895 | A1 | 5/2017 | Baks et al. | |
| 2018/0226314 | A1* | 8/2018 | Chen | H01L 23/10 |
| 2019/0312331 | A1 | 10/2019 | Sakurai | |
| 2020/0075503 | A1* | 3/2020 | Chuang | H01L 25/165 |

FOREIGN PATENT DOCUMENTS

| | | |
|---|---|---|
| CN | 103855458 A | 6/2014 |
| CN | 106450659 A | 2/2017 |
| CN | 107481998 A | 12/2017 |
| CN | 107660319 A | 2/2018 |
| CN | 107968084 A | 4/2018 |
| CN | 108417559 A | 8/2018 |
| EP | 3211977 A1 | 8/2017 |
| WO | 2018116886 A1 | 6/2018 |
| WO | 2018125240 A1 | 7/2018 |

* cited by examiner

```
┌─────────────────────────────────────────────────────────────────────┐
│ Provide a first substrate and a second substrate, where the first   │
│ substrate and the second substrate each include a first surface and │
│ a second surface, a first antenna radiation sheet is disposed on    │─── S301
│ the first surface of the first substrate, a second antenna          │
│ radiation sheet is disposed on the first surface of the second      │
│ substrate, and an adhesive layer is coated on the second surface    │
│ of the first substrate                                              │
└─────────────────────────────────────────────────────────────────────┘
                                   ▼
┌─────────────────────────────────────────────────────────────────────┐
│ Form a plurality of supporting blocks spaced apart from each other  │
│ on a partial area that is of the first surface of the second        │─── S302
│ substrate and that is not provided with the second antenna          │
│ radiation sheet                                                     │
└─────────────────────────────────────────────────────────────────────┘
                                   ▼
┌─────────────────────────────────────────────────────────────────────┐
│ Form a plurality of bumps spaced apart from each other on a         │─── S303
│ surface of the supporting block                                     │
└─────────────────────────────────────────────────────────────────────┘
                                   ▼
┌─────────────────────────────────────────────────────────────────────┐
│ Place the first substrate and the second substrate based on a       │
│ position relationship that the second surface of the first          │
│ substrate faces the first surface of the second substrate, align    │─── S304
│ the second antenna radiation sheet with the first antenna radiation │
│ sheet, and laminate the first substrate and the second substrate,   │
│ to cause the supporting blocks to adhere to the first substrate     │
│ by using an adhesive layer                                          │
└─────────────────────────────────────────────────────────────────────┘
                                   ▼
┌─────────────────────────────────────────────────────────────────────┐
│ Form a radio frequency chip on the second surface of the second     │─── S305
│ substrate                                                           │
└─────────────────────────────────────────────────────────────────────┘
                                   ▼
┌─────────────────────────────────────────────────────────────────────┐
│ Form a metal solder ball on the second surface of the second        │─── S306
│ substrate                                                           │
└─────────────────────────────────────────────────────────────────────┘
```

FIG. 3

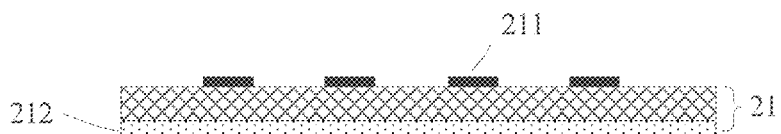

FIG. 4A

FIG. 4B

```
┌─────────────────────────────────────────────────────────────┐
│ Provide a first substrate and a second substrate, where the │
│ first substrate and the second substrate each include a     │
│ first surface and a second surface, a first antenna         │── S601
│ radiation sheet is disposed on the first surface of the     │
│ first substrate, a second antenna radiation sheet is        │
│ disposed on the first surface of the second substrate, and  │
│ an adhesive layer is coated on a partial area that is of    │
│ the first surface of the second substrate and that is not   │
│ provided with the second antenna radiation sheet            │
└─────────────────────────────────────────────────────────────┘
                              ↓
┌─────────────────────────────────────────────────────────────┐
│ Form a plurality of supporting blocks spaced apart from     │── S602
│ each other on the second surface of the first substrate     │
└─────────────────────────────────────────────────────────────┘
                              ↓
┌─────────────────────────────────────────────────────────────┐
│ Form a plurality of bumps spaced apart from each other on   │── S603
│ a surface of the supporting block                           │
└─────────────────────────────────────────────────────────────┘
                              ↓
┌─────────────────────────────────────────────────────────────┐
│ Place the first substrate and the second substrate based on │
│ a position relationship that the second surface of the      │
│ first substrate faces the first surface of the second       │── S604
│ substrate, align the second antenna radiation sheet with    │
│ the first antenna radiation sheet, and laminate the first   │
│ substrate and the second substrate, to cause the supporting │
│ blocks to adhere to the first substrate by using an         │
│ adhesive layer                                              │
└─────────────────────────────────────────────────────────────┘
                              ↓
┌─────────────────────────────────────────────────────────────┐
│ Form a radio frequency chip on the second surface of the    │── S605
│ second substrate                                            │
└─────────────────────────────────────────────────────────────┘
                              ↓
┌─────────────────────────────────────────────────────────────┐
│ Form a metal solder ball on the second surface of the       │── S606
│ second substrate                                            │
└─────────────────────────────────────────────────────────────┘
```

FIG. 6

FIG. 7A

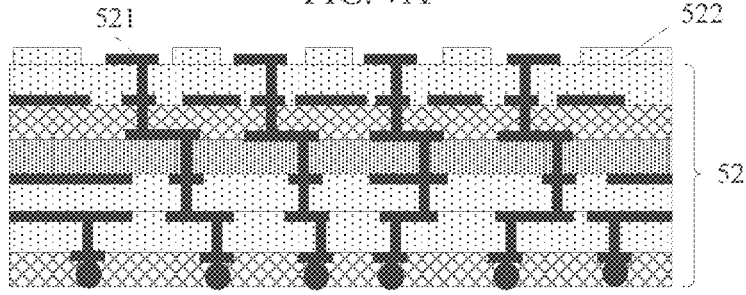

FIG. 7B

ANTENNA IN PACKAGE STRUCTURE AND MANUFACTURING METHOD THEREFOR

CROSS-REFERENCE TO RELATED APPLICATIONS

This application is a continuation of International Patent Application No. PCT/CN2018/111041 filed on Oct. 19, 2018, which is hereby incorporated by reference in its entirety.

TECHNICAL FIELD

This application relates to the field of antenna in package technologies, and in particular, to an antenna in package structure and a manufacturing method therefor.

BACKGROUND

With the advent of a fifth generation (5G) high-speed communications era and development of virtual reality (VR), millimeter-wave communication gradually becomes the mainstream. Design and application requirements of millimeter-wave antennas are also increasing.

Because a length of a transmission path in a millimeter wave band has great impact on a signal amplitude loss, a conventional architecture mode of an integrated circuit (IC) plus a printed circuit board (PCB) plus an antenna gradually cannot meet a performance requirement of a short transmission path in the millimeter wave band.

In addition, a wavelength of a millimeter wave frequency band is extremely short, and electrical performance is very sensitive to a processing error. If manufacturing precision is low, impedance mismatch may occur and cause signal reflection. In addition, a conventional PCB processing technology can no longer meet a requirement for millimeter wave processing precision. Therefore, a packaging processing technology with higher processing precision has brought larger value.

In an architecture of an IC plus a packaged antenna, namely, an antenna in package (AiP) antenna technology, an antenna feeder path is extremely short, allowing an equivalent isotropic radiated power (EIRP) value of a wireless system to be maximized, thereby facilitating wider coverage. In addition, compared with a PCB processing technology, a processing technology of the AiP antenna technology has higher processing precision. Therefore, the AiP antenna technology will gradually become a mainstream antenna technology in 5G and millimeter-wave high-speed communications systems.

An AiP structure is usually a structure of dual substrates. An antenna cavity of a particular height is disposed between the dual substrates. The height of the antenna cavity corresponds to a wavelength of an antenna radiation signal, and has important impact on radiation performance of the antenna. Once the wavelength of the antenna radiation signal is fixed, the height of the antenna cavity also needs to be fixed. However, in an existing AiP structure, a height of an antenna cavity between dual substrates is unstable. Consequently, radiation performance of the antenna deteriorates due the antenna cavity with the unstable height, causing relatively poor antenna performance.

SUMMARY

In view of this, this application provides an antenna in package structure and a manufacturing method therefor, to improve stability of a height of an antenna cavity between dual substrates, to improve antenna performance.

To resolve the foregoing technical problem, the following technical solutions are used in this application.

A first aspect of this application provides an antenna in package structure, including a first substrate, a second substrate, and a plurality of supporting blocks spaced apart from each other. The first substrate and the second substrate are disposed opposite to each other. A first antenna radiation sheet is disposed on a surface of the first substrate that faces away from or faces the second substrate. A second antenna radiation sheet is disposed on a surface of the second substrate that faces the first substrate. The plurality of supporting blocks are located between the first substrate and the second substrate. At least one of the first substrate or the second substrate adheres to the plurality of supporting blocks using an adhesive layer. The second antenna radiation sheet is located in a gap between the plurality of supporting blocks.

In the antenna in package structure provided in the first aspect of this application, a plurality of supporting blocks spaced apart from each other are disposed between the first substrate and the second substrate, and an antenna cavity is formed between every two adjacent supporting blocks. Therefore, a height of the supporting block determines a height of the antenna cavity. The plurality of supporting blocks spaced apart from each other are located between the first substrate and the second substrate, and at least one of the first substrate or the second substrate adheres to the plurality of supporting blocks spaced apart from each other using the adhesive layer. In addition, the plurality of supporting blocks spaced apart from each other do not experience a phenomenon of high-temperature metal melting, and can maintain relatively high stability even after a plurality of times of high-temperature thermal cycles. Therefore, heights of the plurality of supporting blocks spaced apart from each other do not change. Therefore, in the antenna in package structure, a distance between two substrates is relatively stable, and does not change in a manufacturing process and a subsequent use process of the antenna in package structure. Therefore, the antenna in package structure has a relatively stable antenna cavity height, and has relatively favorable antenna performance.

In a possible implementation, the adhesive layer is disposed on a surface of the first substrate that faces the second substrate, the supporting block is disposed on a surface of the second substrate that faces the first substrate, and the supporting block adheres to the first substrate using the adhesive layer.

In a possible implementation, the first antenna radiation sheet is disposed on a surface of the first substrate that faces away from the second substrate. In this possible implementation, an adhesive layer can be directly coated on the surface of the first substrate that faces the second substrate. Therefore, a preparation process is relatively simple.

In a possible implementation, the supporting block is disposed on a surface of the first substrate that faces the second substrate, the adhesive layer is disposed on at least a partial surface area that is of the second substrate, that faces the first substrate, and that is not provided with the second antenna radiation sheet, and the supporting block adheres to the second substrate using the adhesive layer.

In a possible implementation, a plurality of bumps spaced apart from each other are disposed on a surface that is of the supporting block and that adheres to the substrate, and a gap between the bumps is filled with an adhesive material forming the adhesive layer. In this possible implementation, a contact area between the adhesive layer and the supporting block can be increased, thereby improving an adhesion force between the adhesive layer and the supporting block, such that adhesion between the first substrate and the second substrate is firmer, a formed structure is more stable, reliability is higher, and a layer crack caused during metal tin soldering does not occur. In addition, disposition of the bump can also limit flowability of the adhesive material of the adhesive layer on the second surface of the first substrate, thereby preventing the adhesive material from being squeezed into the antenna cavity and affecting antenna performance.

In a possible implementation, the plurality of bumps spaced apart from each other are distributed on the supporting block in a comb-shaped manner. In this possible implementation, an adhesion force between the adhesive layer and the supporting block can be further improved, such that adhesion between the first substrate and the second substrate is firmer, a formed structure is more stable, and reliability is higher.

In a possible implementation, the bump is a cylindrical bump or a strip bump.

In a possible implementation, a material of the supporting block is resin or metal.

In a possible implementation, the second substrate is a substrate provided with a plurality of routing layers.

In a possible implementation, the antenna in package structure further includes a radio frequency chip disposed on a surface of the second substrate that faces away from the first substrate.

In a possible implementation, the antenna in package structure further includes a metal solder ball disposed on a surface of the second substrate that faces away from the first substrate, and the metal solder ball is configured to implement electrical connection to an external circuit.

A second aspect of this application provides a manufacturing method for an antenna in package structure, including providing a first substrate and a second substrate, where the first substrate and the second substrate each include a first surface and a second surface, a first antenna radiation sheet is disposed on one of the first surface and the second surface of the first substrate, a second antenna radiation sheet is disposed on the first surface of the second substrate, and an adhesive layer is coated on the second surface of the first substrate, forming a plurality of supporting blocks spaced apart from each other on a partial area that is of the first surface of the second substrate and that is not provided with the second antenna radiation sheet, where the plurality of supporting blocks are located on the area that is of the first surface of the second substrate and that is not provided with the second antenna radiation sheet, placing the first substrate and the second substrate based on a position relationship that the second surface of the first substrate faces the first surface of the second substrate, and laminating the first substrate and the second substrate, such that the plurality of supporting blocks adhere to the first substrate using the adhesive layer, where the second antenna radiation sheet is located in a gap between the plurality of supporting blocks.

According to the second aspect of this application, the antenna in package structure provided in the first aspect can be manufactured. The first antenna radiation sheet is disposed on a surface of the first substrate that faces away from the second substrate. In this way, in the preparation method, an adhesive layer can be directly coated on the surface of the first substrate that faces the second substrate. Therefore, a preparation process is relatively simple.

In a possible implementation, forming a plurality of supporting blocks spaced apart from each other on the first surface of the second substrate includes forming a resin layer of a specific thickness on the first surface of the second substrate, and etching the resin layer on the second antenna radiation sheet until the second antenna radiation sheet is exposed, such that a supporting block is formed on the etched resin layer.

In a possible implementation, forming a plurality of supporting blocks spaced apart from each other on the first surface of the second substrate includes forming the plurality of supporting blocks spaced apart from each other on the first surface of the second substrate using a solder mask process of multiple exposure and development.

In a possible implementation, forming a plurality of supporting blocks spaced apart from each other on the first surface of the second substrate includes, after holes of a screen stencil are filled with resin, forming the plurality of supporting blocks spaced apart from each other on the first surface of the second substrate using a thermal curing molding process.

In a possible implementation, after forming a plurality of supporting blocks spaced apart from each other on the first surface of the second substrate, and before placing the first substrate and the second substrate based on a position relationship that the second surface of the first substrate faces the first surface of the second substrate, the method further includes forming a plurality of bumps spaced apart from each other on a surface of the supporting block. In the antenna in package structure manufactured in this possible implementation, a contact area between the adhesive layer and the supporting block can be increased, thereby improving an adhesion force between the adhesive layer and the supporting block, such that adhesion between the first substrate and the second substrate is firmer, a formed structure is more stable, reliability is higher, and a layer crack caused during metal tin soldering does not occur. In addition, disposition of the bump can also limit flowability of an adhesive material of the adhesive layer on the second surface of the first substrate, thereby preventing the adhesive material from being squeezed into the antenna cavity and affecting antenna performance.

In a possible implementation, after laminating the first substrate and the second substrate, the method further includes forming a radio frequency chip on the second surface of the second substrate.

In a possible implementation, after forming a radio frequency chip, the method further includes forming a metal solder ball on the second surface of the second substrate, where the metal solder ball is configured to implement electrical connection to an external circuit.

A third aspect of this application provides a manufacturing method for an antenna in package structure, including providing a first substrate and a second substrate, where the first substrate and the second substrate each include a first surface and a second surface, a first antenna radiation sheet is disposed on one of the first surface and the second surface of the first substrate, a second antenna radiation sheet is disposed on the first surface of the second substrate, and an adhesive layer is coated on at least a partial area that is of the first surface of the second substrate and that is not provided with the second antenna radiation sheet, forming a plurality of supporting blocks spaced apart from each other on the second surface of the first substrate, placing the first substrate and the second substrate based on a position relationship that the second surface of the first substrate faces the first surface of the second substrate, and laminating the first substrate and the second substrate, such that the plurality of supporting blocks spaced apart from each other adhere to the second substrate using the adhesive layer, where the second antenna radiation sheet is located in a gap between the plurality of supporting blocks.

According to the third aspect of this application, the antenna in package structure provided in the first aspect can be manufactured. A preparation process of the preparation method is relatively simple.

In a possible implementation, forming a plurality of supporting blocks spaced apart from each other on the second surface of the first substrate includes forming a resin layer of a specific thickness on the second surface of the first substrate, and etching the resin layer, such that the etched resin layer forms a plurality of supporting blocks spaced apart from each other, where the plurality of supporting blocks spaced apart from each other do not overlap an orthographic projection of the first antenna radiation sheet on the first substrate.

In a possible implementation, forming a supporting block on the first surface of the second substrate includes forming the supporting block on the first surface of the second substrate using a solder mask process of multiple exposure and development.

In a possible implementation, forming a plurality of supporting blocks spaced apart from each other on the first surface of the second substrate includes after holes of a screen stencil are filled with resin, forming the plurality of supporting blocks spaced apart from each other on the first surface of the second substrate using a thermal curing molding process.

In a possible implementation, after forming a supporting block on the first surface of the second substrate, and before the placing the first substrate and the second substrate based on a position relationship that the second surface of the first substrate faces the first surface of the second substrate, the method further includes forming a plurality of bumps spaced apart from each other on a surface of the supporting block. In this possible implementation, a contact area between the adhesive layer and the supporting block can be increased, thereby improving an adhesion force between the adhesive layer and the supporting block, such that adhesion between the first substrate and the second substrate is firmer, a formed structure is more stable, reliability is higher, and a layer crack caused during metal tin soldering does not occur. In addition, disposition of the bump can also limit flowability of an adhesive material of the adhesive layer on the second surface of the first substrate, thereby preventing the adhesive material from being squeezed into the antenna cavity and affecting antenna performance.

In a possible implementation, after laminating the first substrate and the second substrate, the method further includes forming a radio frequency chip on the second surface of the second substrate.

In a possible implementation, after forming a radio frequency chip, the method further includes forming a metal solder ball on the second surface of the second substrate, where the metal solder ball is configured to implement electrical connection to an external circuit.

BRIEF DESCRIPTION OF DRAWINGS

FIG. 3 is a schematic flowchart of a manufacturing method for an antenna in package structure according to an embodiment of this application.

FIG. 4A, FIG. 4B, FIG. 4C, FIG. 4D, FIG. 4E, and FIG. 4F are schematic structural diagrams corresponding to a series of manufacturing processes of a manufacturing method for an antenna in package structure according to an embodiment of this application.

FIG. 6 is a schematic flowchart of another manufacturing method for an antenna in package structure according to an embodiment of this application.

FIG. 7A, FIG. 7B, FIG. 7C.

DESCRIPTION OF EMBODIMENTS

In an existing AiP structure, an antenna and a chip are directly manufactured in one package body.

Figure 1:
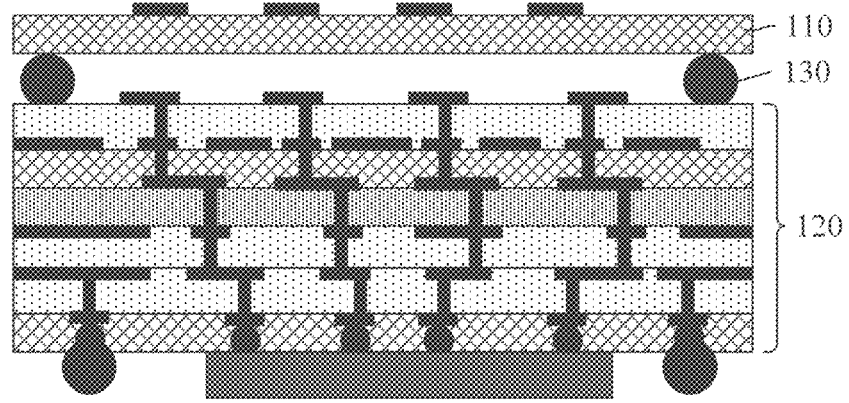
FIG. 1 is a schematic diagram of an AiP structure.

In the existing AiP structure, as shown in FIG. 1, an upper substrate 110 and a lower substrate 120 are welded together using a solder ball 130, and a distance between the upper substrate 110 and the lower substrate 120, that is, a height of an antenna cavity, is controlled using a height of the solder ball 130.

However, the solder ball is thermally unstable, and a metal melting phenomenon occurs at a high temperature, resulting in instability of the height of the solder ball, and further making the distance between the upper substrate and the lower substrate unstable.

To resolve the problem of unstable distance between the upper substrate and the lower substrate in the AiP structure, this application provides a new antenna in package structure. In this antenna in package structure, a plurality of supporting blocks spaced apart from each other are disposed between a first substrate and a second substrate, and an antenna cavity is formed between every two adjacent supporting blocks. Therefore, a height of the supporting block determines a height of the antenna cavity. The plurality of supporting blocks spaced apart from each other are located between the first substrate and the second substrate, and at least one of the first substrate or the second substrate adheres to the plurality of supporting blocks spaced apart from each other using the adhesive layer. In addition, the plurality of supporting blocks spaced apart from each other do not experience a phenomenon of high-temperature metal melting like the solder ball, and can maintain relatively high stability even after a plurality of times of high-temperature thermal cycles. Therefore, heights of the plurality of supporting blocks spaced apart from each other do not change. Therefore, in the antenna in package structure, a distance between two substrates is relatively stable, and does not change in a manufacturing process and a subsequent use process of the antenna in package structure. Therefore, the antenna in package structure has a relatively stable antenna cavity height, and has relatively favorable antenna performance.

To clearly understand implementations of this application, the following describes the implementations of this application in detail with reference to the accompanying drawings.

Figure 2:
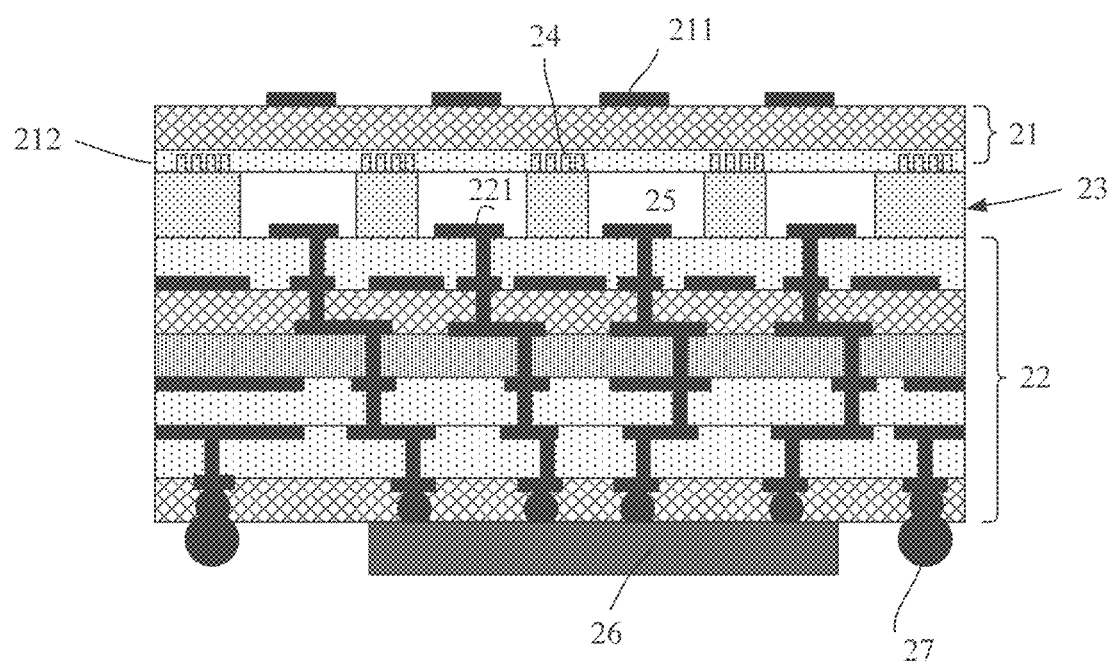
FIG. 2 is a schematic diagram of an antenna in package structure according to an embodiment of this application.

Referring to FIG. 2, an antenna in package structure provided in an embodiment of this application includes a first substrate 21, a second substrate 22, and a plurality of supporting blocks 23 spaced apart from each other.

The first substrate 21 and the second substrate 22 are disposed opposite to each other. Furthermore, a normal direction of the first substrate 21 is the same as a normal direction of the second substrate 22. In other words, a connection line between a center of the first substrate 21 and a center of the second substrate 22 is perpendicular to the first substrate 21 and the second substrate 22.

A first antenna radiation sheet 211 is disposed on a surface of the first substrate 21 that face away from the second substrate 22, and a second antenna radiation sheet 221 is disposed on a surface of the second substrate 22 that faces the first substrate 21. The second antenna radiation sheet 221 is aligned with the first antenna radiation sheet 211, such that resonance between the two antenna radiation sheets can be implemented.

The plurality of supporting blocks 23 spaced apart from each other are formed on the surface of the second substrate 22 that faces the first substrate, and adhere to a surface of the first substrate 21 that faces the second substrate using an adhesive layer.

In an example of this application, to make the supporting block 23 better adhere to the first substrate 21, the first substrate 21 may be a two-layer board structure with an antenna radiation sheet. An adhesive layer 212 is disposed on the surface of the first substrate 21 that faces the second substrate. In this way, the supporting block 23 may adhere to the first substrate 21 using the adhesive layer 212 to form an integral structure. It should be noted that the adhesive layer 212 may be laminated on a second surface of the first substrate 21 using a thermal lamination process.

It should be noted that, in this embodiment of this application, a gap between two adjacent supporting blocks 23 is enclosed using the two substrates 21 and 22 to form a cavity 25. The second radiation sheet 221 is located in the gap between the two adjacent supporting blocks 23. In other words, the second antenna radiation sheet 221 is located in the cavity 25. It should be noted that, in this embodiment of this application, because the supporting block 23 is formed on the surface of the second substrate 22 that faces the first substrate, it may also be considered that the second substrate in this embodiment of this application is a substrate with one surface provided with the supporting block 23.

In addition, a radio frequency chip 26 may be further disposed on a surface of the second substrate 22 that faces away from the first substrate 21. The radio frequency chip 26 may be formed on the surface of the second substrate 22 that faces away from the first substrate 21 using a flip-chip process or a conventional flip chip process.

In addition, to implement signal transmission between the antenna in package structure and an external environment, a metal solder ball 27 may be further disposed on the surface of the second substrate 22 that faces away from the first substrate 21. The metal solder ball 27 is configured to implement signal transmission with an external printed circuit board. In an example, the metal solder ball 27 may be a ball grid array (BGA) ball.

It should be noted that, in this embodiment of this application, one of the first antenna radiation sheet 211 and the second antenna radiation sheet 221 is a primary antenna radiation sheet, and the other is a secondary antenna radiation sheet. In another example, to improve antenna radiation performance, both the first antenna radiation sheet 211 and the second antenna radiation sheet 221 may be antenna radiation sheet arrays, that is, include a plurality of antenna radiation sheets.

In an embodiment of this application, the second substrate 22 may include a multi-layer interconnection wire layer. For example, the multi-layer interconnection wire layer may be a 4-layer or 6-layer interconnection wire layer. A layer quantity of the interconnection wire layer of the second substrate 22 may be adjusted based on wiring and performance requirements.

It should be noted that, in this embodiment of this application, a height of the supporting block 23 determines a distance between the first substrate 21 and the second substrate 22, that is, determines a height of the antenna cavity. In addition, the height of the antenna cavity is related to antenna performance such as an antenna frequency. Therefore, the height of the supporting block 23 is not set arbitrarily, but is related to the antenna performance such as the antenna frequency. More further, the height of the supporting block 23 needs to be obtained through simulation based on the antenna performance. When the antenna is a millimeter-wave antenna in a frequency band of 10 gigahertz (GHz) to 400 GHz, the height of the supporting block 23 may be between 270 micrometers ($\mu$m) and 300 $\mu$m.

In addition, a material of the supporting block 23 may be a metal or resin material. In an example of this application, the supporting block 23 may be a resin material. Furthermore, the resin material may be a chemically etchable resin material.

The supporting block 23 is formed using a resin material. In one aspect, because the resin material has relatively good flexibility, the supporting block 23 can have a good shock resistance and crack resistance effect on an adhesion structure of the first substrate 21 and the second substrate 22, finally making reliability of the antenna in package structure relatively high. In another aspect, the supporting block 23 needs to adhere to the first substrate 21 using an adhesive material, and according to a principle of similar compatibility, adhesion between the resin material and the adhesive material is greater than that between a metal material and the adhesive material. Therefore, from a perspective of improving adhesion between the supporting block 23 and the first substrate 21, the supporting block 23 may be made of a resin material.

In another example of this application, to improve an adhesion force between the first substrate 21 and the second substrate 22, to make the first substrate 21 adhere to the second substrate 22 more firmly, a plurality of bumps 24 spaced apart from each other may be further disposed on a surface that is of the supporting block 23 that adheres to the first substrate 21. In an example, the plurality of bumps 24 spaced apart from each other may be distributed on the supporting block 23 in a comb-shaped manner. In another example, the bump 24 may be a cylindrical bump or a strip bump.

When the bumps 24 are disposed on the surface that is of the supporting block 23 and that adheres to the first substrate 21, in a process of laminating the first substrate 21 and the second substrate 22, the bumps 24 may be embedded into the adhesive layer on the second surface of the first substrate 21, such that the bumps 24 are also filled with an adhesive material constituting the adhesive layer. In this way, a contact area between the adhesive layer and the supporting block 23 can be increased, thereby improving an adhesion force between the adhesive layer and the supporting block 23, such that adhesion between the first substrate 21 and the second substrate 22 is firmer, a formed structure is more stable, reliability is higher, and a layer crack caused during metal tin soldering does not occur.

In addition, disposition of the bump 24 can also limit flowability of the adhesive material of the adhesive layer 212 on the second surface of the first substrate 21, thereby preventing the adhesive material from being squeezed into the antenna cavity and affecting antenna performance.

In another example, the bump 24 may be formed by etching an upper surface of the supporting block 23, or may be made using a solder mask process of exposure and development.

It should be noted that in this embodiment of this application, the supporting block 23 may be made using a plurality of processes. For example, in a first manner, the supporting block 23 is formed using an etching process using existing mature chemically etchable resin. In a second manner, the supporting block 23 is made using a solder mask process of multiple exposure and development. In a third manner, the supporting block 23 is made using a screen stencil, and after holes of the screen stencil are filled with resin, the supporting block is formed on the first surface of the second substrate using a thermal curing molding process.

Manufacturing methods of these processes are to be described in detail when an implementation of a manufacturing method for an antenna in package structure is described subsequently.

It should be noted that a supporting block manufacturing process used in this application makes production efficiency of an antenna cavity in an antenna in package structure relatively high and production costs relatively low.

The foregoing is an implementation of an antenna in package structure provided in an embodiment of this application. The antenna in package structure provided in this implementation has the following effects:

1. The distance between the first substrate 21 and the second substrate 22 is determined by the supporting block 23 with stable performance. In addition, there are a plurality of supporting blocks 23, the supporting blocks 23 are spaced apart from each other, and an antenna cavity 25 is formed between adjacent supporting blocks 23. The supporting blocks 23 do not experience a phenomenon of high-temperature metal melting like the solder ball, and can maintain relatively high stability even after a plurality of times of high-temperature thermal cycles. Therefore, heights of the supporting blocks do not change. Therefore, in the antenna in package structure, a distance between two substrates is relatively stable, and does not change in a manufacturing process and a subsequent use process of the antenna in package structure. Therefore, the antenna in package structure has a relatively stable antenna cavity height, and has relatively favorable antenna performance.

In addition, because the distance between the first substrate 21 and the second substrate 22 is stable, a relative position relationship between the first antenna radiation sheet 211 and the second antenna radiation sheet 221 is also relatively stable. In a process of manufacturing the antenna in package structure, a problem of alignment shift between the first antenna radiation sheet and the second antenna radiation sheet does not occur. Therefore, alignment between the first antenna radiation sheet and the second antenna radiation sheet is relatively accurate.

2. When the supporting block 23 is made of a resin material, because the resin material has relatively high flexibility, the supporting block 23 has a particular stress buffer function, and can have a particular shock resistance and crack resistance effect at an adhesion interface between the first substrate 21 and the second substrate 22. Therefore, a shock resistance effect of the antenna in package structure provided in this embodiment of this application is good, a phenomenon of cracking at an adhesion position does not easily occur, and reliability of a drop test of the antenna in package structure is high.

3. When a plurality of bumps 24 spaced apart from each other are disposed on a surface that is of the supporting block 23 and that adheres to the substrate, in a process of laminating the supporting block 23 to the substrate, the bumps 24 may be embedded into the adhesive layer on the second surface of the first substrate 21, such that the bumps 24 are also filled with an adhesive material. In this way, a contact area between the adhesive layer and the supporting block 23 can be increased, thereby improving an adhesion force between the adhesive layer and the supporting block 23, such that adhesion between the first substrate 21 and the second substrate 22 is firmer, a formed structure is more stable, reliability is higher, and a layer crack caused during metal tin soldering does not occur. In addition, disposition of the bump 24 can also limit flowability of the adhesive material of the adhesive layer 212 on the second surface of the first substrate 21, thereby preventing the adhesive material from being squeezed into the antenna cavity and affecting antenna performance.

4. In this embodiment of this application, the first substrate 21 and the second substrate 22 adhere together using the supporting blocks 23, and a gap exists between different supporting blocks 23. Therefore, the first substrate 21 and the second substrate 22 that adhere together are not completely closed, but are still in an open state between the supporting blocks 23. In this way, using an open space formed by the gap between the supporting blocks 23, better radiation can be implemented for a signal of the second antenna radiation sheet 221 located in the antenna cavity 25, such that the antenna in package structure provided in this embodiment of this application has good antenna radiation performance.

5. In this embodiment of this application, the first antenna radiation sheet is disposed on the surface of the first substrate that faces away from the second substrate. In this possible implementation, an adhesive layer can be directly coated on the surface of the first substrate that faces the second substrate. Therefore, a preparation process is relatively simple.

The foregoing is an implementation of an antenna in package structure provided in an embodiment of this application. Based on the antenna in package structure provided in the foregoing embodiment, this application further provides a manufacturing method for the antenna in package structure. For details, refer to the following embodiments.

Referring to FIG. 3 to FIG. 4, the manufacturing method for an antenna in package structure provided in the embodiments of this application includes the following steps.

S301: Provide a first substrate and a second substrate, where the first substrate and the second substrate each include a first surface and a second surface, a first antenna radiation sheet is disposed on the first surface of the first substrate, a second antenna radiation sheet is disposed on the first surface of the second substrate, and an adhesive layer is coated on the second surface of the first substrate.

FIG. 4A is a schematic structural diagram of a first substrate 21, and FIG. 4B is a schematic structural diagram of a second substrate 22. The first substrate 21 includes a first surface and a second surface, a first antenna radiation sheet 211 is disposed on the first surface of the first substrate 21, and an adhesive layer 212 is coated on the second surface of the first substrate. It should be noted that, in this embodiment of this application, the adhesive layer 212 covers the entire second surface of the first substrate.

S302: Form a plurality of supporting blocks spaced apart from each other on a partial area that is of the first surface of the second substrate and that is not provided with the second antenna radiation sheet.

It should be noted that, in this embodiment of this application, a plurality of supporting blocks 23 spaced apart from each other may be formed on the first surface of the second substrate 22 using a plurality of processes.

In an example of S302, the plurality of supporting blocks may be formed using an etching process using existing mature chemically etchable resin. An implementation of the example may be as follows:

A1: Form a resin layer of a specific thickness on the first surface of the second substrate.

It should be noted that the thickness of the resin layer is related to a height of a finally formed antenna cavity. Therefore, the specific thickness may be the height of the finally formed antenna cavity, and may be obtained based on a simulation experiment.

A2: Etch a resin layer on the second antenna radiation sheet until the second antenna radiation sheet is exposed, such that the plurality of supporting blocks 23 spaced apart from each other are formed on the etched resin layer.

In another example of S302, the plurality of supporting blocks may be made using a solder mask process of multiple exposure and development. An implementation of the example may be as follows:

The plurality of supporting blocks 23 spaced apart from each other are formed on the first surface of the second substrate using a solder mask process of multiple exposure and development.

In another example of S302, the plurality of supporting blocks may be made using a screen stencil. An implementation of the example may be as follows:

B1: Dispose a screen stencil on the first surface of the second substrate, where holes of the screen stencil are aligned with the area that is of the first surface of the second substrate and that is not provided with the second antenna radiation sheet.

B2: Fill the holes with resin, and then form the plurality of supporting blocks 23 spaced apart from each other on the first surface of the second substrate using a thermal curing molding process.

Figure 4C:
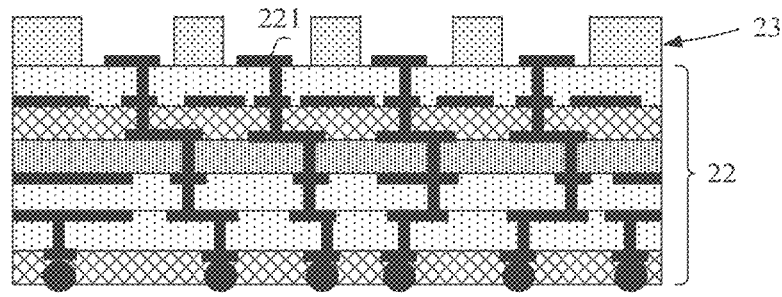

A corresponding schematic structural diagram of the second substrate after this step is performed is shown in FIG. 4C.

S303: Form a plurality of bumps spaced apart from each other on a surface of the supporting block.

In an example, to simplify the process, the bumps 24 may be formed by etching an upper surface of the supporting block 23. In this way, the plurality of bumps 24 spaced apart from each other are formed on the upper surface of the supporting block 23.

It should be noted that, when the bump 24 is formed by etching the supporting block 23, to strengthen an adhesion force between the two substrates, the bump 24 is pressed into the adhesive layer 212. In this way, the bump 24 does not contribute to the height of the antenna cavity. Therefore, in this case, when the supporting block 23 is formed, a height of the formed supporting block 23 is greater than the height of the antenna cavity, and the height of the supporting block 23 is greater than the height of the antenna cavity by a height of the bump 24.

In addition, a material layer may be first formed on the upper surface of the supporting block 23, and then a plurality of bumps 24 spaced apart from each other are formed by etching the material layer. It should be noted that the material layer may be a resin material layer or a metal material layer. Correspondingly, the formed bump 24 may be a resin block or a metal block. Because the metal block has a small size and there is a plurality of metal blocks, the metal blocks may be considered as a tooth structure extending from the upper surface of the supporting block 23.

Figure 4D:
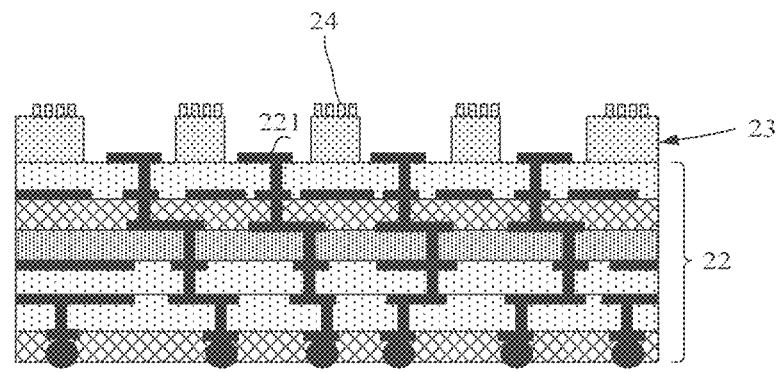

A corresponding schematic structural diagram of the second substrate after this step is performed is shown in FIG. 4D.

S304: Place the first substrate and the second substrate based on a position relationship that the second surface of the first substrate faces the first surface of the second substrate, align the second antenna radiation sheet with the first antenna radiation sheet, and laminate the first substrate and the second substrate, to cause the supporting blocks to adhere to the first substrate using an adhesive layer, such that a cavity is formed between two adjacent supporting blocks, and the second antenna radiation sheet is located in the cavity.

It should be noted that when the first substrate 21 and the second substrate 22 are laminated, the bumps 24 on the upper surface of the supporting block 23 are pressed into the adhesive layer 212 due to a lamination effect, thereby enhancing the adhesion force between the first substrate 21 and the second substrate 22, and making a finally formed structure more stable.

Figure 4E:
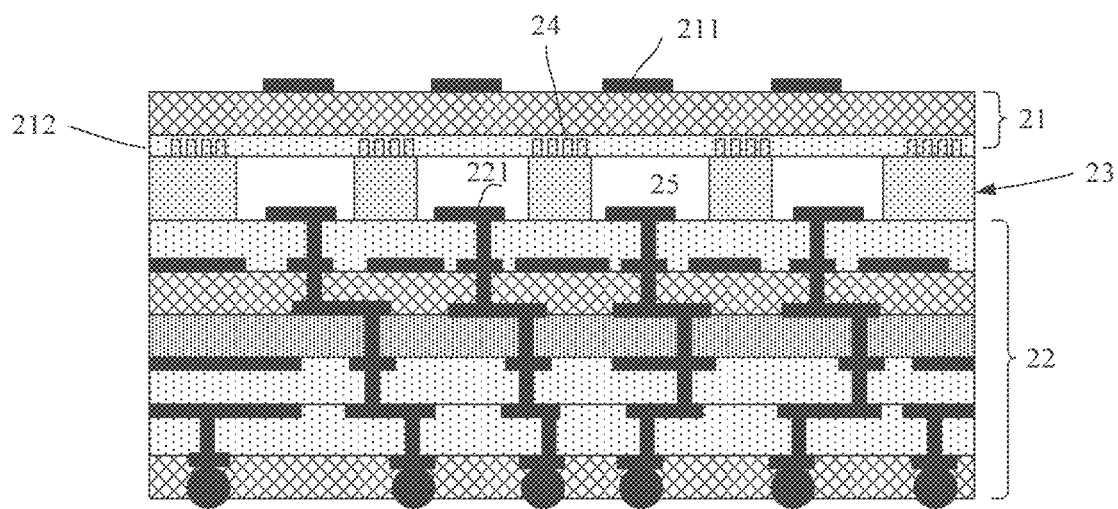

A corresponding schematic structural diagram after this step is performed is shown in FIG. 4E.

S305: Form a radio frequency chip on the second surface of the second substrate.

Figure 4F:
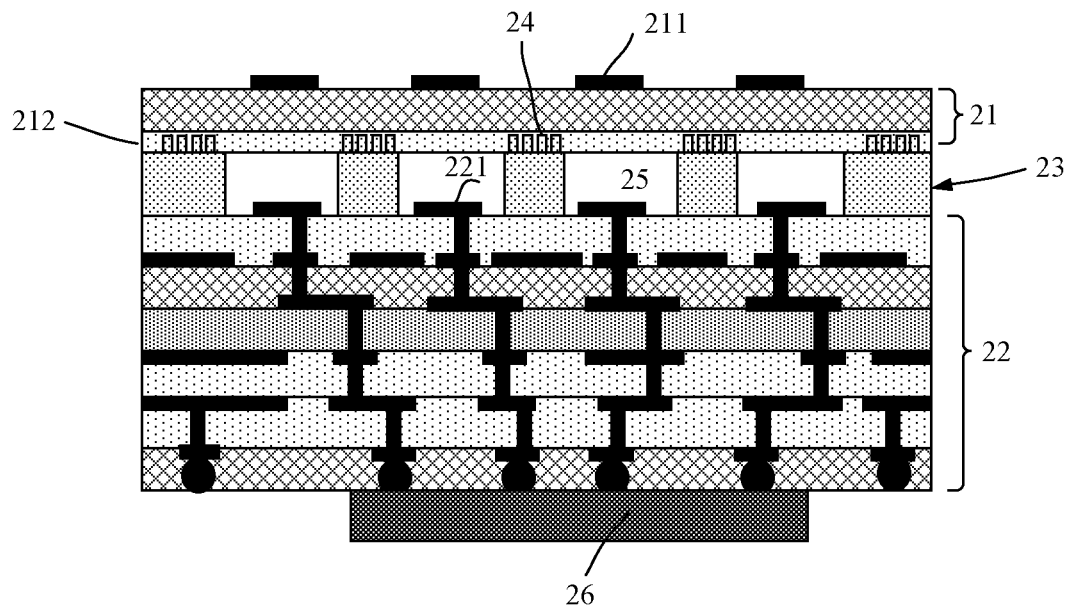

In this step, the radio frequency chip 26 may be attached to the second surface of the second substrate 22 using a flip-chip process or a conventional flip chip process. A corresponding schematic structural diagram after this step is performed is shown in FIG. 4F.

S306: Form a metal solder ball on the second surface of the second substrate.

This step may include implanting a ball on the second surface of the second substrate using a conventional process, to form a metal solder ball 27 for transmitting a signal to an external environment. The metal solder balls 27 may be configured to implement electrical connection to an external circuit.

A corresponding schematic structural diagram after this step is performed is shown in FIG. 2.

The foregoing is an implementation of the antenna in package structure and the manufacturing method therefor provided in the embodiments of this application. In the foregoing implementation, an example in which the supporting block 23 is formed on the first surface of the second substrate 22 and adheres to the second surface of the first substrate 21 is used for description. Actually, in another implementation of the antenna in package structure provided in this application, the supporting block 23 may also be formed on the second surface of the first substrate 21, and then adhere to the first surface of the second substrate 22. For details, refer to the following embodiment.

Figure 5:
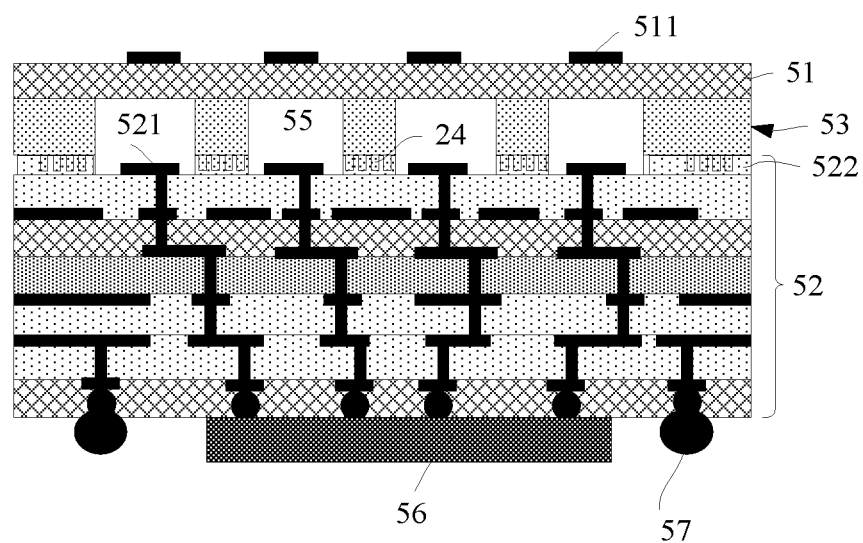
FIG. 5 is a schematic diagram of another antenna in package structure according to an embodiment of this application.

Referring to FIG. 5, another antenna in package structure provided in an embodiment of this application includes a first substrate 51, a second substrate 52, and a plurality of supporting blocks 53 spaced apart from each other.

The first substrate 51 and the second substrate 52 are disposed opposite to each other. Furthermore, a normal direction of the first substrate 51 is the same as a normal direction of the second substrate 52. In other words, a connection line between a center of the first substrate 51 and a center of the second substrate 52 is perpendicular to the first substrate 51 and the second substrate 52.

A first antenna radiation sheet 511 is disposed on a surface of the first substrate 51 that faces away from the second substrate 52.

A second antenna radiation sheet 521 is disposed on a surface of the second substrate 52 that faces the first substrate 51, and an adhesive layer 522 needs to be coated on a partial surface area that is of the second substrate 52, that faces the first substrate, and that is not provided with the second antenna radiation sheet.

The second antenna radiation sheet 521 is aligned with the first antenna radiation sheet 511, such that resonance between the two antenna radiation sheets can be implemented.

The plurality of supporting blocks spaced apart from each other 53 are formed on a surface of the first substrate 51 that faces the second substrate 52, and adhere to the surface of the second substrate 52 that faces the first substrate using the adhesive layer 522.

It should be noted that, in this embodiment of this application, a cavity 55 is formed between two adjacent supporting blocks 53, and the second antenna radiation sheet 521 is located in the cavity 55. It should be noted that, in this embodiment of this application, because the supporting block 53 is formed on the second surface of the first substrate 51, it may also be considered that the first substrate in this embodiment of this application is a substrate with a second surface provided with the supporting block 53.

In addition, a radio frequency chip 56 may be further disposed on a surface of the second substrate 52 that faces away from the first substrate. The radio frequency chip 56 may be formed on the surface of the second substrate 52 that faces away from the first substrate using a flip-chip process.

In addition, to implement signal transmission between the antenna in package structure and an external environment, a metal solder ball 57 may be further disposed on the surface of the second substrate 52 that faces away from the first substrate. The metal solder ball 57 is configured to implement signal transmission with an external printed circuit board. In an example, the metal solder ball 57 may be a BGA ball.

It should be noted that the antenna in package structure provided in this embodiment of this application has a plurality of similarities with the antenna in package structure used in the foregoing embodiment. A difference lies in that, in this embodiment of this application, the supporting block 53 is formed on the surface of the first substrate 51 that faces the first substrate. In this way, an adhesive layer may not be disposed on the surface of the first substrate 51 that faces the first substrate, while the adhesive layer 522 needs to be coated on the partial surface area that is of the second substrate 52, that faces the first substrate, and that is not provided with the second antenna radiation sheet. Because the adhesive layer 522 is coated only on the partial surface area of the second substrate 52 that faces the first substrate 51, during manufacturing of the antenna in package structure provided in this application, the adhesive layer 522 needs to be coated on the surface of the second substrate 52 that faces the first substrate 51 using a dispensing process.

Based on the antenna in package structure shown in FIG. 5, this application further provides an implementation of a manufacturing method for the antenna in package structure. Referring to FIG. 6 to FIG. 7E, the manufacturing method for an antenna in package structure provided in the embodiments of this application includes the following steps.

S601: Provide a first substrate and a second substrate, where the first substrate and the second substrate each include a first surface and a second surface, a first antenna radiation sheet is disposed on the first surface of the first substrate, a second antenna radiation sheet is disposed on the first surface of the second substrate, and an adhesive layer is coated on a partial area that is of the first surface of the second substrate and that is not provided with the second antenna radiation sheet.

FIG. 7A is a schematic structural diagram of a first substrate 51, and FIG. 7B is a schematic structural diagram of a second substrate 52. A first antenna radiation sheet 511 is disposed on a first surface of the first substrate 51, a second antenna radiation sheet 521 is disposed on a first surface of the second substrate 52, and an adhesive layer 522 is coated on a partial area that is of the first surface of the second substrate and that is not provided with the second antenna radiation sheet 521.

S602: Form a plurality of supporting blocks spaced apart from each other on the second surface of the first substrate.

It should be noted that an implementation of forming the supporting block 53 in this step may be the same as an implementation of forming the supporting block 23 in S302. For brevity, details are not described herein again.

Figure 7C:
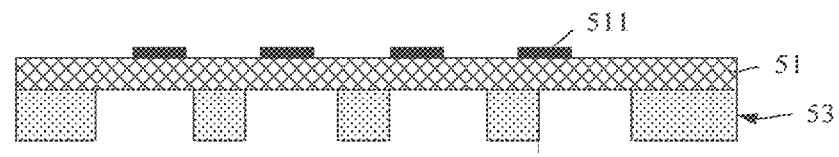

A corresponding schematic structural diagram of the first substrate after this step is performed is shown in FIG. 7C.

S603: Form a plurality of bumps spaced apart from each other on a surface of the supporting block.

It should be noted that an implementation of forming the supporting block 53 in this step may be the same as an implementation of forming the supporting block 23 in S302. For brevity, details are not described herein again.

Figure 7D:
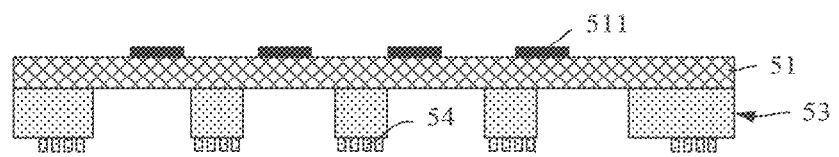
FIG. 7D, and FIG. 7E are schematic structural diagrams corresponding to a series of manufacturing processes of another manufacturing method for an antenna in package structure according to an embodiment of this application.
Figure 7E:
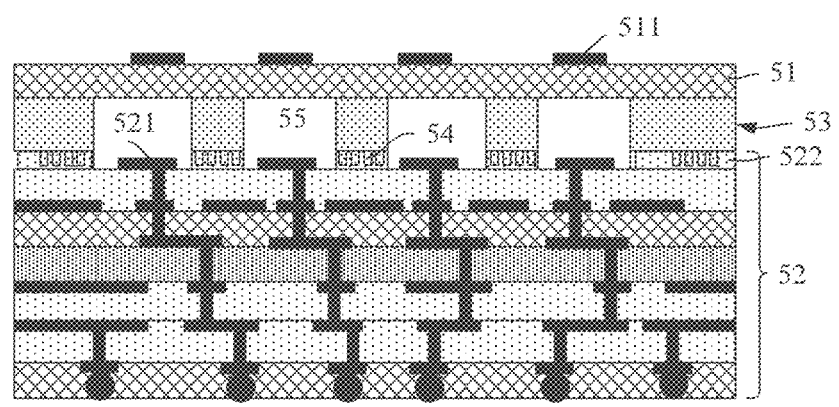

A corresponding schematic structural diagram of the first substrate after this step is performed is shown in FIG. 7D.

S604: Place the first substrate and the second substrate based on a position relationship that the second surface of the first substrate faces the first surface of the second substrate, align the second antenna radiation sheet with the first antenna radiation sheet, and laminate the first substrate and the second substrate, to cause the supporting blocks to adhere to the first substrate using an adhesive layer, such that a cavity is formed between two adjacent supporting blocks, and the second antenna radiation sheet is located in the cavity.

It should be noted that an implementation of this step may be the same as an implementation of S304. For brevity, details are not described herein again.

A corresponding schematic structural diagram after this step is performed is shown in FIG. 7E.

S605 and S606 are the same as S305 and S306. For brevity, details are not described herein again.

The foregoing is another implementation of the antenna in package structure and the manufacturing method thereafter provided in the embodiments of this application.

The antenna in package structure provided in this specific implementation has the same effect as the antenna in package structure provided in the foregoing embodiment. For brevity, details are not described herein again.

It should be noted that, in the antenna in package structure provided in the foregoing embodiment, the first antenna radiation sheet is described using an example in which the first antenna radiation sheet is disposed on a surface of the first substrate that faces away from the second substrate. Actually, in another embodiment of this application, the first antenna radiation sheet may be further disposed on a surface of the first substrate that faces the second substrate. It should be noted that, when the first antenna radiation sheet is disposed on the surface of the first substrate that faces the second substrate, the adhesive layer disposed on the surface of the first substrate that faces the second substrate may be located only on a partial surface area that is not provided with the first antenna radiation sheet.

In addition, in the antenna in package structure provided in the foregoing embodiment, an example in which a supporting block is formed on a surface of a substrate is used for description. Actually, as an extension of this embodiment of this application, the supporting block may alternatively be a structure completely independent of the substrate, and may adhere to the two substrates. For details, refer to the following embodiment.

Figure 8:
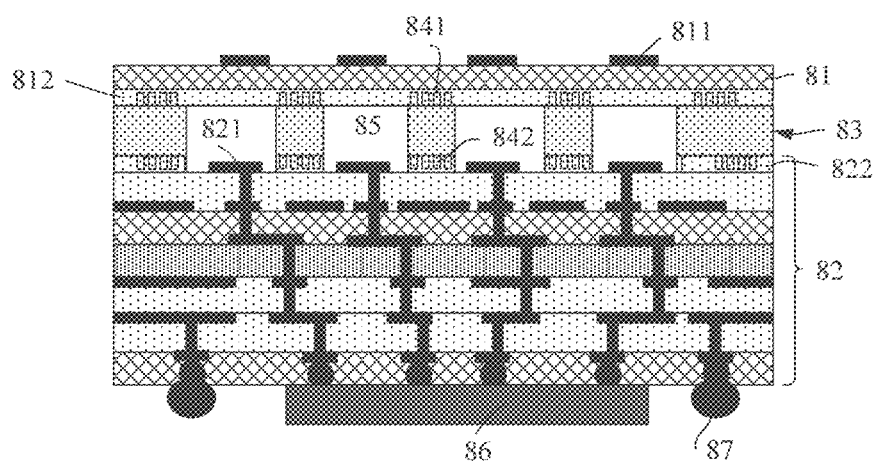
FIG. 8 is a schematic diagram of still another antenna in package structure according to an embodiment of this application.

Referring to FIG. 8, still another implementation of an antenna in package structure provided in an embodiment of this application includes a first substrate 81, a second substrate 82, and a plurality of supporting blocks spaced apart from each other 83.

The first substrate 81 and the second substrate 82 are disposed opposite to each other. Furthermore, a normal direction of the first substrate 81 is the same as a normal direction of the second substrate 82, and a connection line between a center of the first substrate 81 and a center of the second substrate 82 is perpendicular to the first substrate 81 and the second substrate 82.

A first antenna radiation sheet 811 is disposed on a surface of the first substrate 81 that faces away from the second substrate 82, and a first adhesive layer 812 is disposed on a surface of the first substrate 81 that faces the second substrate 82.

A second antenna radiation sheet 821 is disposed on a surface of the second substrate 82 that faces the first substrate 81, and a second adhesive layer 822 is disposed on a partial surface area that is of the second substrate 82, that faces the first substrate 81, and that is not provided with the second antenna radiation sheet.

The second antenna radiation sheet 821 is aligned with the first antenna radiation sheet 811, such that resonance between the two antenna radiation sheets can be implemented.

The plurality of supporting blocks spaced apart from each other 83 are located between the first substrate 81 and the second substrate 82, adhere to the first substrate 81 using the first adhesive layer 812, and adhere to the second substrate 82 using the second adhesive layer 812.

It should be noted that, in this embodiment of this application, a cavity 85 is formed between two adjacent supporting blocks 83, and the second antenna radiation sheet 821 is located in the cavity 85.

In addition, to improve an adhesive force between the supporting block 83 and the substrate, a plurality of first bumps 841 spaced apart from each other are disposed on a surface that is of the supporting block 83 and that adheres to the first substrate 81, and a plurality of second bumps 842 spaced apart from each other are disposed on a surface that is of the supporting block 83 and that adheres to the second substrate 82.

A forming method and structure of the first bump 841 and the second bump 842 may be the same as a forming method and structure of the bump 24 in the foregoing embodiment. For brevity, details are not described herein again.

In addition, a radio frequency chip 86 may be further disposed on a surface of the second substrate 82 that faces away from the first substrate 81. The radio frequency chip 86 may be formed on the surface of the second substrate 82 that faces away from the first substrate 81 using a flip-chip process or a conventional flip chip process.

In addition, to implement signal transmission between the antenna in package structure and an external environment, a metal solder ball 87 may be further disposed on the surface of the second substrate 82 that faces away from the first substrate 81. The metal solder ball 87 is configured to implement signal transmission with an external printed circuit board. In an example, the metal solder ball 87 may be a BGA ball.

The foregoing is an implementation of the antenna in package structure and the manufacturing method therefor provided in the embodiments of this application.

What is claimed is:

1. An antenna in package structure comprising:
  a first substrate comprising:
    a first surface; and
    a second surface;
  a second substrate comprising:
    a third surface facing the second surface; and
    a fourth surface facing away from the first surface;
  a first antenna radiation sheet disposed on the first surface or the second surface;
  a second antenna radiation sheet disposed on the third surface;
  an adhesive layer;
  a plurality of supporting blocks spaced apart from each other and located between the first substrate and the second substrate, wherein the plurality of supporting blocks comprise fifth surfaces that adhere to the first substrate; and
  a plurality of bumps spaced apart from each other and disposed on the fifth surfaces, and wherein a plurality of adhesive gaps among the plurality of bumps is filled with an adhesive material forming the adhesive layer,
  wherein at least one of the first substrate or the second substrate adheres to the plurality of supporting blocks using the adhesive layer,
  wherein the second antenna radiation sheet is located in a plurality of antenna gaps between the plurality of supporting blocks, and
  wherein a height of the plurality of antenna gaps is defined by a height of the plurality of supporting blocks, less a height of the plurality of bumps.

2. The antenna in package structure of claim 1, wherein the adhesive layer is disposed on the second surface, and wherein the supporting blocks are disposed on the third surface and are adhered to the first substrate using the adhesive layer.

3. The antenna in package structure of claim 2, wherein the first antenna radiation sheet is disposed on the first surface.

4. The antenna in package structure of claim 1, wherein the plurality of supporting blocks are disposed on the second surface, wherein the adhesive layer is disposed on a partial surface area of the third surface that does not comprise the second antenna radiation sheet, and wherein the plurality of supporting blocks adhere to the second substrate using the adhesive layer.

5. The antenna in package structure of claim 1, wherein the plurality of bumps is distributed on each supporting block of the plurality of supporting blocks in a comb-shaped manner.

6. The antenna in package structure of claim 1, wherein each bump of the plurality of bumps is a cylindrical bump or a strip bump.

7. The antenna in package structure of claim 1, wherein the second substrate further comprises a plurality of routing layers.

8. The antenna in package structure of claim 1, further comprising a radio frequency chip disposed on the fourth surface.

9. The antenna in package structure of claim 1, further comprising a metal solder ball disposed on the fourth surface and configured to implement electrical connection to an external circuit.

10. A method for an antenna in package structure, wherein the method comprises:
providing a first substrate comprising a first surface and a second surface;
disposing a first antenna radiation sheet on one of the first surface or the second surface;
providing a second substrate comprising a third surface and a fourth surface;
disposing a second antenna radiation sheet on the third surface;
coating an adhesive layer on the second surface;
forming a plurality of supporting blocks spaced apart from each other on a partial area of the third surface that does not comprise the second antenna radiation sheet, wherein the second antenna radiation sheet is located in a plurality of antenna gaps among the plurality of supporting blocks;
after forming the plurality of supporting blocks, forming a plurality of bumps spaced apart from each other on each of a fifth surface of each supporting block of the plurality of supporting blocks, wherein a height of the plurality of antenna gaps is defined by a height of the plurality of supporting blocks, less a height of the plurality of bumps;
after forming the plurality of bumps, positioning the first substrate and the second substrate such that the second surface faces the third surface; and
laminating the first substrate and the second substrate to adhere the plurality of supporting blocks to the first substrate using the adhesive layer, wherein a plurality of adhesive gaps among the plurality of bumps is filled with an adhesive material forming the adhesive layer.

11. The method of claim 10, further comprising:
forming a resin layer of a specific thickness on the third surface; and
etching the resin layer on the second antenna radiation sheet until the second antenna radiation sheet is exposed to form each supporting block of the plurality of supporting blocks on the resin layer.

12. The method of claim 10, further comprising further forming the plurality of supporting blocks using a solder mask process of multiple exposure and development.

13. The method of claim 10, further comprising:
disposing a screen stencil on the third surface so that holes of the screen stencil are aligned with the partial area;
filling the holes with a resin; and
further forming the plurality of supporting blocks using a thermal curing molding process.

14. A method for an antenna in package structure, wherein the method comprises:
providing a first substrate comprising a first surface and a second surface;
disposing a first antenna radiation sheet on one of the first surface or the second surface;
providing a second substrate comprising a third surface and a fourth surface;
disposing a second antenna radiation sheet on the third surface;
coating an adhesive layer on a partial area of the third surface that does not comprise the second antenna radiation sheet;
forming a plurality of supporting blocks spaced apart from each other on the second surface, wherein the second antenna radiation sheet is located in a plurality of antenna gaps among the plurality of supporting blocks;
after forming the plurality of supporting blocks, forming a plurality of bumps spaced apart from each other on each of a fifth surface of each supporting block of the plurality of supporting blocks, wherein a height of the plurality of antenna gaps is defined by a height of the plurality of supporting blocks, less a height of the plurality of bumps;
after forming the plurality of bumps, positioning the first substrate and the second substrate such that the second surface faces the third surface; and
laminating the first substrate and the second substrate to adhere the plurality of supporting blocks to the second substrate using the adhesive layer, wherein a plurality of adhesive gaps among the plurality of bumps is filled with an adhesive material forming the adhesive layer.

15. The method of claim 14, further comprising:
forming a resin layer of a specific thickness on the second surface; and
etching the resin layer to form the plurality of supporting blocks spaced apart from each other, wherein the plurality of supporting blocks do not overlap an orthographic projection of the first antenna radiation sheet on the first substrate.

16. The method of claim 14, further comprising further forming the plurality of supporting blocks on the third surface using a solder mask process of multiple exposure and development.

17. The method of claim 14, further comprising:
disposing a screen stencil on the third surface so that holes of the screen stencil are aligned with the partial area;
filling the holes with a resin; and
further forming the plurality of supporting blocks using a thermal curing molding process.

18. The antenna in package structure of claim 1, wherein the plurality of supporting blocks further comprise a second plurality of bumps spaced apart from each other and disposed on a plurality of surfaces opposite the fifth surfaces, and wherein a plurality of adhesive gaps among the second plurality of bumps is filled with an adhesive material.

19. The method of claim 10 further comprising after forming the plurality of bumps on each of the fifth surface of each supporting block of the plurality of supporting blocks, forming another plurality of bumps on the opposite surface of the each of the plurality of supporting blocks; after forming the another plurality of bumps on the opposite surface, positioning the first substrate and the second substrate such that the second surface faces the third surface; and laminating the first substrate and the second substrate to adhere the plurality of supporting blocks to the first substrate using adhesive layers, wherein a plurality of adhesive gaps among the pluralities of bumps are filled with the adhesive material.

20. The method of claim 14 further comprising: after forming the plurality of bumps on each of the fifth surface of each supporting block of the plurality of supporting blocks, forming another plurality of bumps on the opposite surface of the each of the plurality of supporting blocks; after forming the another plurality of bumps on the opposite surface, positioning the first substrate and the second substrate such that the second surface faces the third surface; and laminating the first substrate and the second substrate to adhere the plurality of supporting blocks to the first substrate using adhesive layers, wherein a plurality of adhesive gaps among the pluralities of bumps are filled with the adhesive material.

* * * * *

UNITED STATES PATENT AND TRADEMARK OFFICE
CERTIFICATE OF CORRECTION

PATENT NO. : 11,637,381 B2
APPLICATION NO. : 17/232798
DATED : April 25, 2023
INVENTOR(S) : Ming Chang Page 1 of 1

It is certified that error appears in the above-identified patent and that said Letters Patent is hereby corrected as shown below:

In the Claims

Claim 19, Column 18, Line 52: "further comprising after" should read "further comprising: after"

Signed and Sealed this
Twenty-third Day of May, 2023

Katherine Kelly Vidal
*Director of the United States Patent and Trademark Office*